United States Patent
Park et al.

[11] Patent Number: 6,039,830
[45] Date of Patent: Mar. 21, 2000

[54] METHOD OF AND APPARATUS FOR LAMINATING A SEMICONDUCTOR WAFER WITH PROTECTIVE TAPE

[75] Inventors: Bae-seung Park; Jin-heung Kim, both of Kyungki-do; Jung-hyun Cho, Seoul, all of Rep. of Korea

[73] Assignee: Samsung Electronics Co., Ltd., Suwon, Rep. of Korea

[21] Appl. No.: 09/114,521

[22] Filed: Jul. 13, 1998

[30] Foreign Application Priority Data

Jul. 25, 1997 [KR]  Rep. of Korea ........................ 97-35183

[51] Int. Cl.[7] .............................. B32B 31/28; B32B 31/18
[52] U.S. Cl. .................. 156/267; 156/273.3; 156/275.5; 156/379.6; 156/510; 156/523; 83/73; 83/651.1
[58] Field of Search ...................... 156/250, 267, 156/272.2, 273.3, 275.5, 275.7, 379.6, 379.8, 510, 523; 83/733, 651.1

[56] References Cited

U.S. PATENT DOCUMENTS 4,779,497  10/1988  Lee .......................................... 156/267
5,840,614  11/1998  Sim et al. ................................ 438/464

*Primary Examiner*—Michael W. Ball
*Assistant Examiner*—Michael A Tolin
*Attorney, Agent, or Firm*—Jones Volentine, LLP

[57] ABSTRACT

A semiconductor wafer tape laminating system includes a loading device for conveying a wafer or cassette to a predetermined location where a laminating process is performed. A laminating device attaches UV tape to the front surface of the wafer conveyed by the loading device. A precutting device having a knife cuts the UV tape around the wafer as spaced therefrom to leave an edge of the tape protruding beyond the peripheral edge of the wafer. A wire cutting device having a wire removes the edge of the UV tape left around the wafer by the precutting device. An ultra-violet illuminator irradiates the edge of the UV tape with ultra-violet rays, and an unloading device carries the wafer to a downstream processing station. When the edge of the UV tape is irradiated with ultra-violet rays, it loses its adhesive strength. Accordingly, the edge will not attach itself to the wafer or to a piece of processing equipment after it is removed by the wire cutting device.

33 Claims, 5 Drawing Sheets

6,039,830

METHOD OF AND APPARATUS FOR LAMINATING A SEMICONDUCTOR WAFER WITH PROTECTIVE TAPE

BACKGROUND OF THE INVENTION

1. Field of the Invention

The present invention relates to a semiconductor wafer tape laminating system and to a method of laminating a semiconductor wafer with a protective tape. More particularly, the present invention pertains to dealing with the edge of adhesive tape protruding from a wafer, the front surface of which is protected by the tape, to prevent the edge from adhering to the wafer or to a piece of processing equipment when it is removed.

2. Description of the Related Art

Generally, the back surface of a semiconductor wafer is not used by the final semiconductor device. Therefore, during the manufacture of the semiconductor device, the back surface is ground to make the wafer as thin as is practical. The front surface of the wafer is laminated with tape prior to the backgrinding of the wafer in order to protect it from grinding water used during the backgrinding process or from wafer dust produced by the backgrinding process. The tape used in this situation is a special adhesive tape which loses its adhesive strength when it is irradiated with a light (for instance, ultra-violet rays) of a predetermined intensity and energy. The light hardens a photosensitive portion (for instance, a photoinitiator) of the tape. Consequently, the UV tape can be easily removed from the front surface of the wafer after the backgrinding process is completed.

The semiconductor wafer tape laminating system also cuts off an edge of the UV tape which protrudes beyond the peripheral edge of the wafer, and then transfers the wafer to the backgrinding station.

Such a laminating system includes a loading device for conveying a wafer or cassette to a predetermined location where the wafer is laminated, a laminating device for pressing the UV tape onto the front surface of the wafer, a precutting device for cutting the UV tape from around the wafer after it has been attached to the front surface thereof, a wire cutting device for removing an edge of the UV tape which protrudes beyond the peripheral edge of the wafer, and an unloading device for carrying the wafer from the wire cutting device.

A knife of the precutting device roughly precuts the UV tape after it attaches to the front surface of the wafer so as to separate the roughly cut portion of the tape, and hence the wafer, from the remainder of the tape. The edge of the UV tape remaining after this precutting is completely removed by a preheated wire of the wire cutting device.

However, the edge of the UV tape removed by the wire cutting device can attach itself to the back of the wafer. If not responded to, this portion of the tape will cause the wafer to crack or break during the backgrinding of the wafer. The edge of the UV tape could also attach itself to other wafers or to various pieces of the manufacturing equipment, resulting in an operation failure. Pieces of the tape which attach themselves to the heated wire of the wire cutting device prevent the wire cutting device from cutting properly. If the piece or pieces stick to the wafer chuck or carrier, they can become adsorbed by the wafer and thus become a source of wafer contamination.

SUMMARY OF THE INVENTION

Therefore, an object of the present invention is to overcome such drawbacks of the prior art. More specifically, an object of the present invention is to provide semiconductor wafer tape laminating systems and laminating methods which reduce the adhesive strength of the edge of the UV tape, which protrudes beyond the peripheral edge of the wafer, so that the edge when removed by the secondary wire cutting device will not attach itself to wafers or to the processing equipment.

To accomplish this object, the present invention provides a semiconductor wafer tape laminating system including a loading device for conveying a wafer or cassette to a predetermined location where a laminating process is performed. A laminating device attaches UV tape to the front surface of the wafer conveyed by the loading device. A precutting knife then cuts the UV tape around the wafer and spaced therefrom to leave an edge of the tape protruding beyond the peripheral edge of the wafer. A wire cutting device comprising a wire removes the edge of the UV tape left around the wafer by the precutting knife. An ultra-violet illuminator irradiates the edge of the UV tape with ultra-violet rays, and an unloading device carries the wafer to a downstream processing station.

The object of the present invention is also achieved by providing a semiconductor wafer tape laminating method comprising the steps of: (a) conveying a wafer or cassette to a predetermined location where a laminating process is performed; (b) attaching a UV tape to the front surface of the wafer; (c) cutting the UV tape with a knife from around the wafer to leave an edge of the tape protruding beyond the peripheral edge of the wafer; (d) irradiating the edge of the UV tape with ultra-violet rays to reduce its adhesive strength; (e) removing the edge of the UV tape edge with a wire; and (f) carrying the wafer to a downstream processing station.

BRIEF DESCRIPTION OF THE ATTACHED DRAWINGS

These and other objects, features and advantages of the invention will be understood more clearly from the following description, made with reference to the accompanying drawings, of which:

DETAILED DESCRIPTION OF THE PREFERRED EMBODIMENTS

Figure 1:
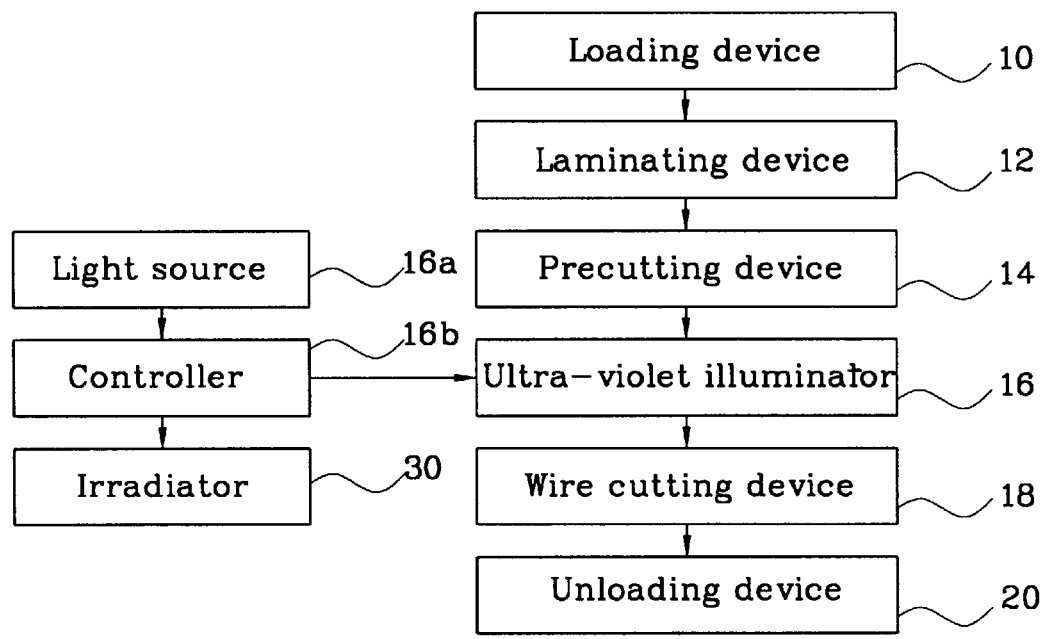
FIG. 1 is a block diagram of a first embodiment of a semiconductor wafer tape laminating system according to the present invention.

Referring to FIG. 1, the first embodiment of the semiconductor wafer tape laminating system of the present invention includes a loading device 10 for conveying a wafer or cassette to a predetermined location where the laminating process is performed, a laminating device 12 for attaching UV tape to the front surface of the wafer, a precutting device 14 comprising a knife for cutting the UV tape attached to the wafer by the laminating device 12, an ultra-violet illuminator 16 for irradiating the edge of the UV tape to reduce its adhesive strength, a wire cutting device 18 comprising a wire for severing the edge of the UV tape from the portion of the tape attached to the front of the wafer, and an unloading device 20 for carrying the wafer to a downstream processing station.

Figure 2:
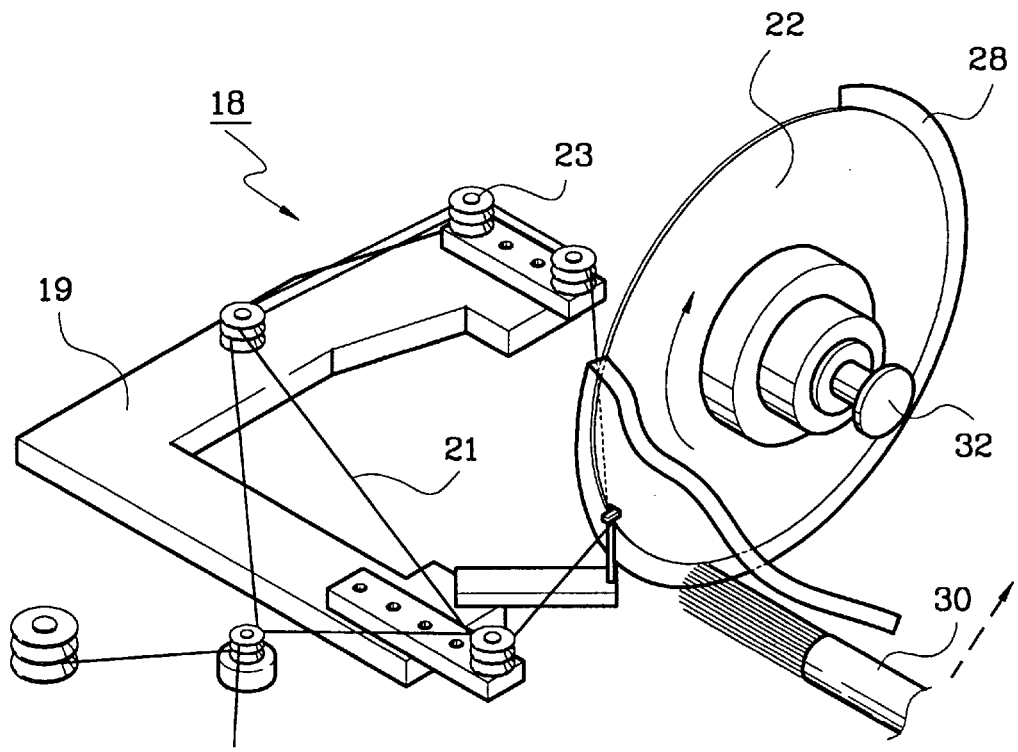
FIG. 2 is a perspective view of a wire cutting device and of an ultra-violet illuminator of the system of FIG. 1.

As shown in FIG. 2, the wire cutting device 18 comprises a swing arm 19, pulleys 23 mounted to the swing arm 19, and a wire 21 moving over the pulleys 23. The wire 21 of the wire cutting device 18 cuts the edge 28 of UV tape adhered to a wafer 22, while the wafer 22 is rotated and the wire 21 is in contact with the peripheral edge of the rotating wafer 22. A heater (not shown) heats the wire 21 to enhance its ability to cut the UV tape. Reference numeral 30 identifies an ultra-violet irradiator, which is described in detail later.

Figure 6:
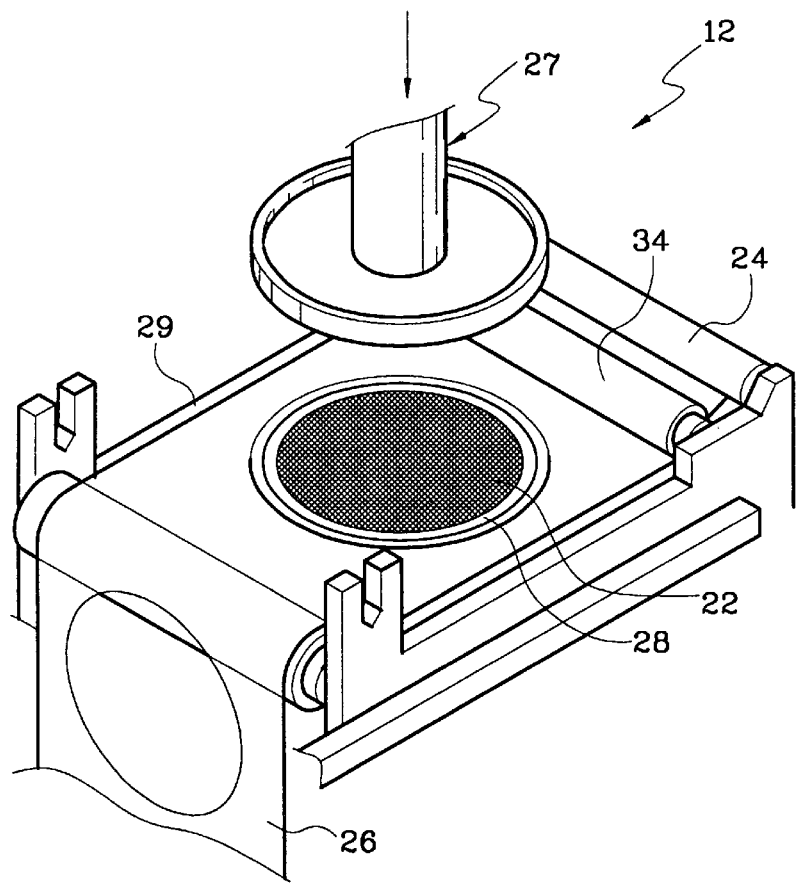
FIG. 6 is a perspective view of the laminating device used in each of the systems of FIGS. 1, 3 and 5.
Figure 7:
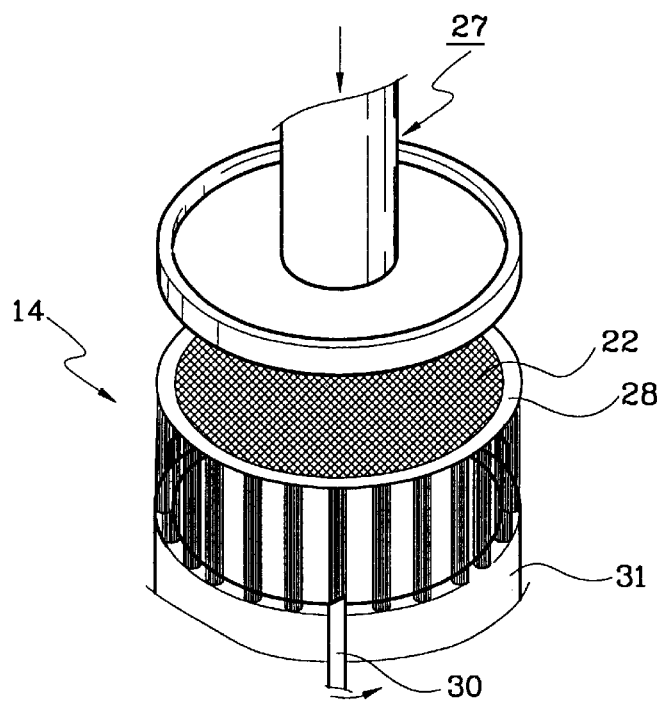
FIG. 7 is a schematic diagram of an integrated precutting/ ultra-violet illuminator of the system of FIG. 5, and which diagram also shows the precutting device used in the system of FIGS. 1 and 3.

Turning next to FIGS. 6 and 7, the precutting device 14 has a cylindrical knife 31 for cutting a roll of UV tape 24 in a close circle around a wafer 22. The knife 31 has a diameter greater than that of wafer 22, and is rotated below a table 29 on which the wafer 22 is supported. The precutting device may further comprise a basket 27 for holding the UV tape 24 against the wafer 22 as the UV tape 24 is cut by the knife 31. The knife 31 cuts the UV tape 24 adjacent a roller 34 which presses the UV tape toward the table 29.

The ultra-violet illuminator 16 in FIG. 1, has an ultra-violet generator for producing ultra-violet radiation, an ultra-violet adjuster for adjusting the intensity of the ultra-violet rays produced by the ultra-violet generator, and an ultra-violet irradiator 30 from which the ultra-violet rays regulated by the ultra-violet adjuster are discharged.

The ultra-violet generator of the ultra-violet illuminator 16 can be a light source 16a selected from the group consisting of a low-pressure mercury lamp, a medium-pressure mercury lamp, a high-pressure mercury lamp, a metal halogen lamp, an electrode-free lamp, or an inert gas lamp. The ultra-violet adjuster comprises a controller 16b for electrically controlling the intensities of the illumination and radiation. The ultra-violet irradiator 30 is preferably an optical fiber(s) because the position of such fibers can be changed easily and optical fibers transmit light with high efficiency.

The ultra-violet irradiator 30 of the ultra-violet illuminator 16, as shown in FIG. 2, is positioned upstream of the wire 21 so as to irradiate the edge 28 of the UV tape with ultra-violet rays prior to its being cut by the wire 21. Thus, the adhesive strength of the tape at its edge 28 is reduced, preventing the edge 28 of the tape from adhering to the back of the wafer or to the various pieces of equipment of the laminating system after the edge 28 is severed by the wire cutting device 18.

A rotary chuck 32 to which the back of the wafer 22 is secured rotates the wafer 22 to move the edge 28 of the UV tape past the ultra-violet irradiator 30. The ultra-violet rays are dispersed from the irradiator 30 over an area sufficient to encompass the width of the edge 28 of the UV tape and at an intensity sufficient to rid the tape of its adhesiveness. As an alternative, the ultra-violet irradiator 30 could be moved around the wafer 22 along the edge thereof to irradiate the edge 28 of the UV tape.

The UV tape comprises a base film of polyolefin coated on one side with an acryllate-containing adhesive having a photoinitiator. The photoinitiator is a radical reactant of a Norrish type which dissolves the C—C sigma bond adjacent to the carbonyl group. The energy of the C—C sigma bond is 90 kcal/mole, the radiation energy of 250 nm being 114 kcal/mole.

Figure 9:
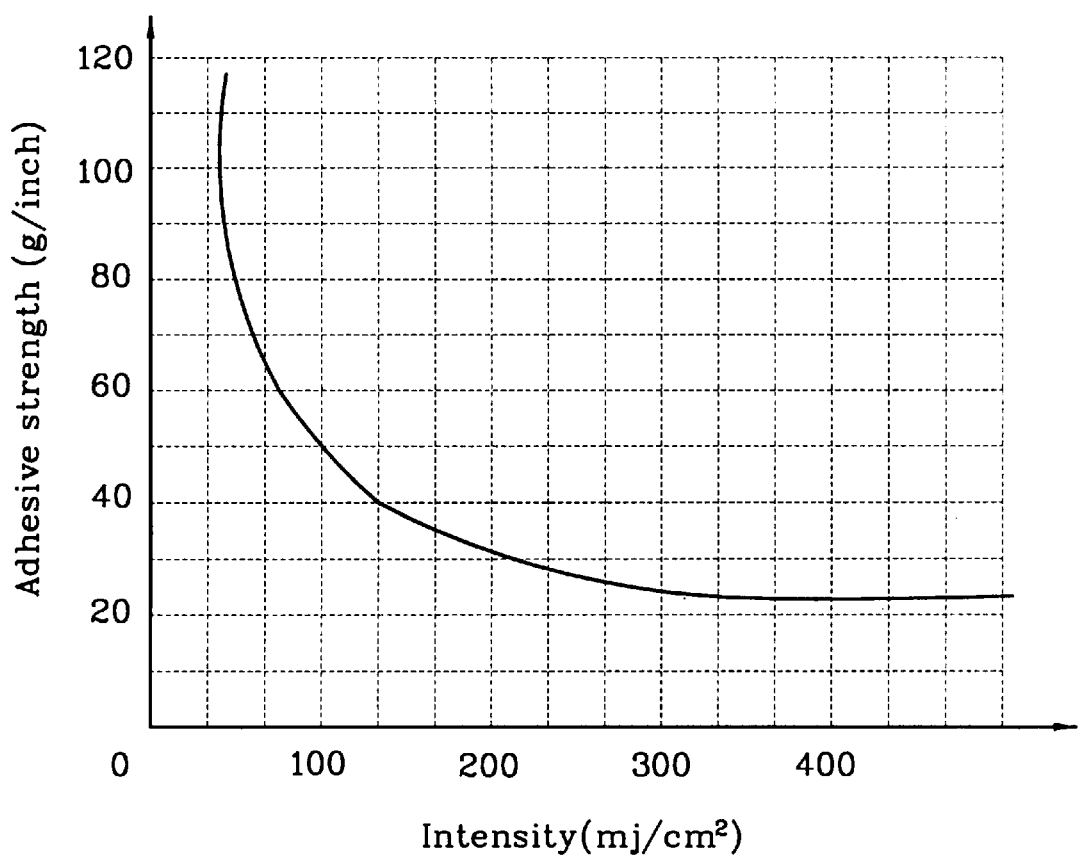
FIG. 9 is a graph of the adhesive characteristics of the UV tape.

FIG. 9 shows the adhesive characteristics of the UV tape at a temperature of 23° C. and a relative humidity of 50%. As can be seen from the figure, as the intensity of the illumination increases, the adhesive strength of the UV tape drops. In particular, the adhesive strength drops rapidly, i.e. in exponential fashion, in the domain of increasing intensities of between 30 mJ/cm$^2$ and 130 mJ/cm$^2$, finally leveling off at 25 g/inch.

Therefore, the ultra-violet irradiator is controlled to emit ultra-violet rays of an intensity of over 70 mJ/cm$^2$ when the temperature is 23° C., the relative humidity is 50%, and the adhesive strength of the UV tape must be reduced to below 60 g/inch. If the adhesive strength must be reduced to below 50 g/inch, the intensity of the ultra-violet rays is regulated to be greater than 100 mJ/cm$^2$. For 40 g/inch, an intensity greater than 130 mJ/cm$^2$ is preferable.

Simply irradiating the UV tape with ultra-violet rays causes the photoinitiator to initiate the radical reaction that reduces the adhesive strength of the tape. Such a mechanism would be well understood by those of ordinary skill in the art. Considering the radiation efficiency of ultra-violet rays, the ultra-violet irradiator generally illuminates ultra-violet rays at an intensity of 350 mJ/cm$^2$. Those areas of the tape not illuminated with rays of high enough intensity do not lose their adhesiveness, because the components at those areas will fail to react or will react insufficiently.

Figure 8:
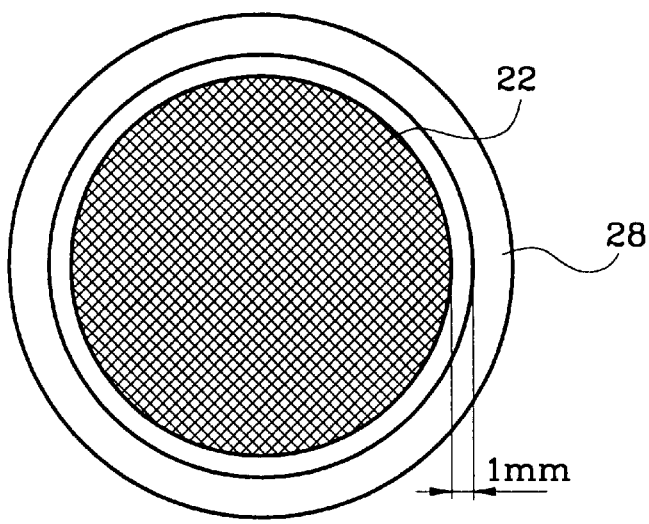
FIG. 8 is a plan view of the laminated wafer showing the area irradiated with UV light by the systems of FIGS. 1 and 5.

As shown in FIG. 8, the inner limit of illumination of the UV tape edge 28 is preferably spaced 1 mm from the peripheral edge of the wafer 22. The 1 mm spacing beyond the peripheral edge of the wafer 22 provides a margin of safety so that the tape will, in turn, not lose its adhesive strength right where the tape leaves the front surface of the wafer 22.

If the ultra-violet rays were to irradiate the peripheral edge of the wafer 22, the tape would likely become separated from wafer 22 during the backgrinding of the wafer (which is the next process carried out on the wafer). In such a case, it would also be likely that foreign matter would enter the space between the tape and the front surface of the wafer, and thereby penetrate into the wafer pattern. For these reasons, the annular space of 1 mm is left between the ultra-violet rays and the peripheral edge of the wafer.

The method of laminating the wafer will now be described in more detail. The wafer 22 is carried by the loading device 10 to the laminating device 12 shown in FIG. 6. The laminating device 12 comprises a table 29 for supporting the wafer 22, and a pressing device for pressing the UV tape against the wafer. In this case, the UV tape is pressed against the front surface of the wafer 22 by a roller 34, and so, the UV tape 24 is attached to the front surface of wafer 22 on the table 29. While the UV tape 24 is held against the front surface of the wafer 22 by the basket 27, the knife 31 of the precutting device 14 cuts the UV tape around the wafer 22 at a distance of 1 cm from the peripheral edge of the wafer. Next, the wafer 22 is removed from the precutting device 14, and the leftover portion 26 of the UV tape is discharged from the table 29 of the laminating device. Next, the wafer is fixed to the rotary chuck 32, and the ultra-violet irradiator 16 irradiates the edge 28 of the UV tape near the wafer 22 but spaced 1 mm from the peripheral edge thereof, while the wafer is rotated by the chuck 32.

The edge of the UV tape edge 28 is thereafter severed by the heated wire 21 of the wire cutting device 18, and so is removed from that portion of the tape adhered to the front surface of the wafer 22. Then, the wafer 22 is removed from the chuck 32 by the unloading device 20, and is carried to the backside grinding equipment.

Figure 3:
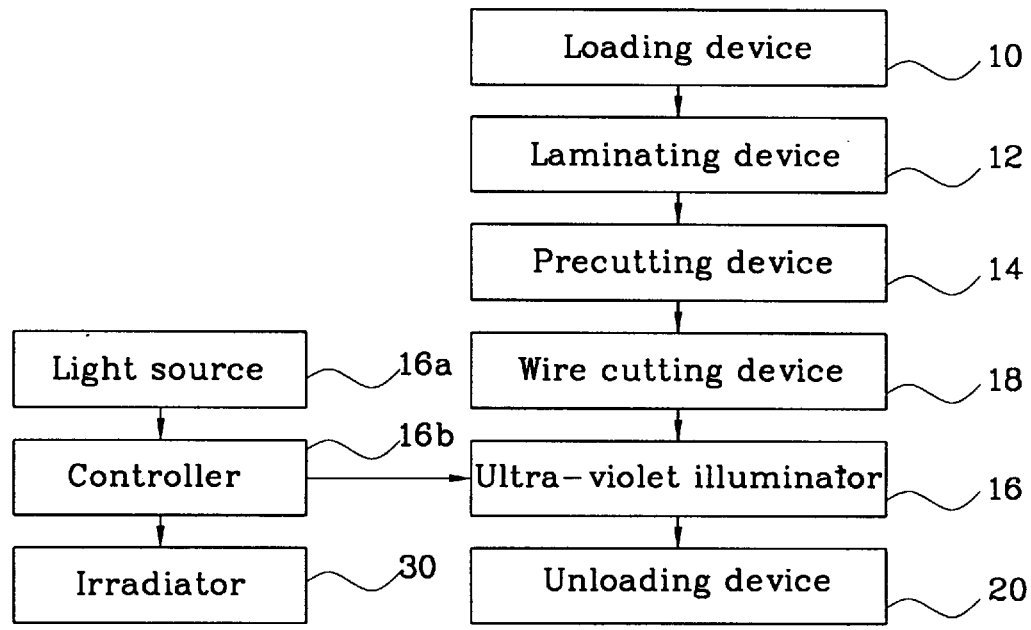
FIG. 3 is a block diagram of a second embodiment of the semiconductor wafer tape laminating system according to the present invention.
Figure 4:
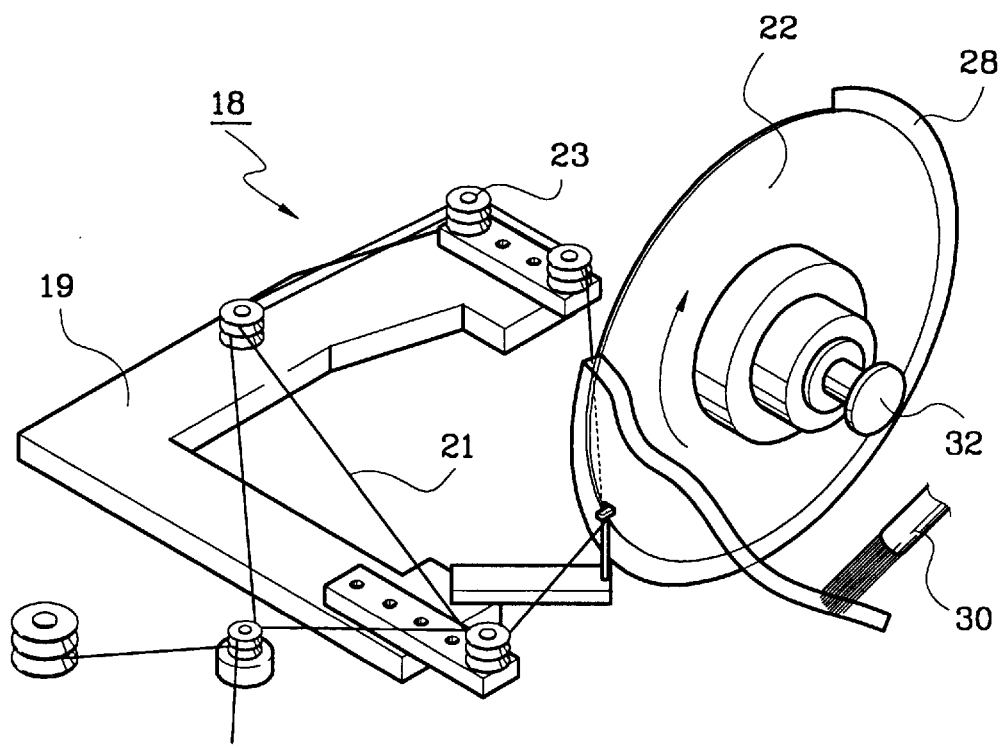
FIG. 4 is a perspective view of the wire cutting device and of an ultra-violet illuminator of the system of FIG. 3.

FIG. 3 shows the second embodiment of the semiconductor wafer tape laminating system of the present invention. Elements which are the same as those of the first embodiment are designated by like reference numerals and a detailed description thereof will be omitted for the sake of brevity. That is, a detailed description of the second embodiment will be limited primarily to the differences between the first and second embodiments.

In this embodiment, the ultra-violet illuminator 16 is positioned downstream of the wire cutting device 18. More specifically, as the wafer 22 is rotated by rotary chuck 32, the edge 28 of the UV tape is severed by the heated wire 21 of the wire cutting device from the portion of the tape adhered to the front surface of the wafer 22. As the severed edge 28 begins to fall, the ultra-violet irradiator 30 irradiates the edge 28 with ultra-violet rays of an intensity sufficient to cause the tape to lose its adhesive strength.

Because the edge 28 of the UV tape is irradiated after it has been cut by the wire 21, the entire edge 28 of the tape can be illuminated to reduce its adhesive strength without fear of illuminating the portion of the tape adhered to the peripheral edge of the wafer 22. In this embodiment, therefore, the area over which the ultra-violet rays are dispersed does not have to be controlled as precisely as in the first embodiment. However, the UV tape that is melted by the heated wire 21 may in some cases adhere to the wire 21 causing a failure.

Figure 5:
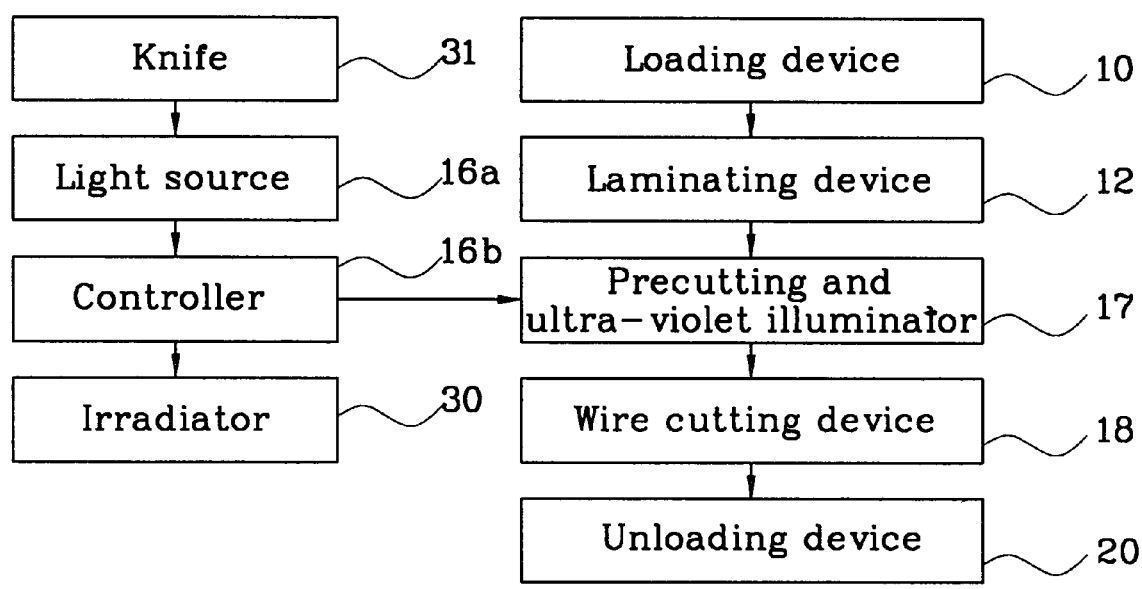
FIG. 5 is a block diagram of a third embodiment of a semiconductor wafer tape laminating system according to the present invention.

FIGS. 5 and 7 show the third embodiment of the semiconductor wafer tape laminating system according to the present invention. Unlike the first and second embodiments, the third embodiment comprises a precutting/ultra-violet illuminator 17 for cutting and irradiating the UV tape after it is attached to the front surface of the wafer 22 by the laminating device 12.

The precutting/ultra-violet illuminator 17 has an ultra-violet generator for producing ultra-violet radiation, an ultra-violet adjuster for adjusting the intensity and energy of the ultra-violet rays produced by the ultra-violet generator, and an ultra-violet irradiator 30 from which the ultra-violet rays are discharged, all integrated with the precutting device 14 of the embodiments previously described.

As shown in FIG. 7, the ultra-violet irradiator 30 of precutting/ultra-violet illuminator 17 is provided in a circular ring coaxial to the annular edge 28 of the UV tape. The irradiator 30 irradiates the edge 28 with ultra-violet rays from below the table 29 at the same time the UV tape is being cut by the knife 31.

The ultra-violet irradiator 30 is disposed close to the edge 28 of the UV tape and illuminates the overall surface of the edge of the tape. In this respect, the irradiator may be of a plurality of discrete ultra-violet illuminating members arranged in a circular ring. Such an arrangement of illuminating members could be rotated for more effectively illuminating the entire edge 28 of the UV tape.

In this embodiment, a wafer 22 is carried to the laminating device 12 where the UV tape is pressed against the front surface of the wafer 22 by the roller 34. That portion of the UV tape 26 which is not adhered to the wafer 22 is cut by the knife 31 with a space of 1 cm left between the knife 31 and the wafer 22. While the wafer 22 is being cut by the knife 31, the 1 cm-wide edge 28 of the tape that is being formed is irradiated by the irradiator 30. Thus, the edge 28 loses its adhesive strength. Thereafter, the edge 28 is removed by the wire 21 of the wire cutting device 18.

As described above, the semiconductor wafer tape laminating method and apparatus reduce the adhesive strength of the edge of the UV tape which is severed by the wire cutting device from the portion of the UV tape adhering to the front surface of the wafer. This prevents the severed edge from attaching to the wafer or to the apparatus. This in turn prevents the apparatus from malfunctioning and from producing a defective wafer.

It will be apparent that many changes and modifications can be made to the present invention without departing from the spirit of the invention. It is therefore intended that the scope of the invention be dictated by the appended claims, and that all such changes and modifications which come within the meaning and range of equivalency of the claims be embraced thereby.

What is claimed is:

1. A semiconductor wafer tape laminating system comprising:

laminating means for attaching UV tape to the front surface of a wafer;

precutting means for cutting the UV tape around the wafer as spaced therefrom to leave an edge of the tape protruding beyond the peripheral edge of the wafer;

wire cutting means for cutting the edge of the UV tape left around the wafer by the precutting device to sever it from a portion of the tape attached to the front surface of the wafer; and ultra-violet illuminator means for irradiating the edge of the UV tape with ultra-violet rays.

2. The system as claimed in claim 1, wherein said wire cutting means comprises a swing arm, a system of pulleys mounted to said swing arm, and a wire reeved around said pulleys.

3. The system as claimed in claim 2, and further comprising a rotary wafer chuck interposed between said laminating means and said wire cutting means in the system, said rotary wafer chuck rotating the wafer at a position that brings the edge of the UV tape into contact with the wire of said wire cutting means so as to be cut by said wire.

4. The system as claimed in claim 1, wherein said laminating means comprises a table, and a roller which presses a sheet of the UV tape toward the table, and said precutting means comprises a cylindrical knife disposed beneath said table adjacent said roller for cutting the sheet of UV tape pressed toward the table by said roller, and a basket disposed above said table opposite said cylindrical knife so as to hold the UV tape while it is being cut by said cylindrical knife.

5. The system as claimed in claim 1, wherein said ultra-violet illuminator means comprises a source of ultra-violet radiation, a controller which adjusts the intensity of the ultra-violet rays produced by the ultra-violet generator, and an ultra-violet irradiator means for discharging the ultra-violet rays whose intensity has been adjusted by the ultra-violet adjuster.

6. The system as claimed in claim 5, wherein said source of ultra-violet radiation is one of a mercury lamp, a metal halogen lamp, an electrode-free lamp, and an inert gas lamp.

7. The system as claimed in claim 5, wherein said ultra-violet irradiator means comprises an optical fiber.

8. The system as claimed in claim 5, wherein said ultra-violet irradiator means is disposed upstream of said wire cutting means so as to irradiate the edge of the UV tape prior to the cutting of the edge by said wire cutting means.

9. The system as claimed in claim 5, wherein said ultra-violet irradiator means is disposed downstream of said wire cutting means so as to irradiate the edge of the UV tape subsequent to the cutting of the edge by said wire cutting means.

10. The system as claimed in claim 5, wherein said ultra-violet irradiator means is integrated with said precutting means so that it illuminates the edge of the UV tape with ultra-violet rays as the UV tape is cut by said precutting means.

11. The system as claimed in claim 10, wherein said laminating means comprises a table and a pressing device which presses the UV tape towards the table, said precutting means comprises a rotary cylindrical knife, and said ultra-violet irradiator means is disposed under said table inside said rotary cylindrical knife.

12. The system as claimed in claim 8, and further comprising a rotary wafer chuck interposed between said laminating means and said wire cutting means in the system, said rotary wafer chuck rotating the wafer at a position that brings the edge of the UV tape into contact with the wire of said wire cutting means so as to be cut by said wire, and wherein said ultra-violet irradiator means is an optical fiber disposed adjacent to said rotary chuck.

13. The system as claimed in claim 9, and further comprising a rotary wafer chuck interposed between said laminating means and said wire cutting means in the system, said rotary wafer chuck rotating the wafer at a position that brings the edge of the UV tape into contact with the wire of said wire cutting means so as to be cut by said wire, and wherein said ultra-violet irradiator means is an optical fiber disposed adjacent to said rotary chuck.

14. The system as claimed in claim 10, wherein said ultra-violet irradiator means comprises a plurality of optical members arranged within said cylindrical knife.

15. The system as claimed in claim 14, wherein said members are arranged in a circular ring.

16. A method of laminating a semiconductor wafer, said method comprising the steps of:

conveying a wafer to a predetermined location;

attaching UV tape, having an adhesive strength which is reduced when irradiated with ultra-violet rays, to the front surface of the wafer at said predetermined location;

cutting the UV tape from around the wafer to leave an edge of the tape protruding beyond the peripheral edge of the wafer;

irradiating the edge of the UV tape with ultra-violet rays to reduce its adhesive strength;

severing the edge of the UV tape from the remainder of the UV tape attached to the front surface of the wafer; and subsequently transporting the wafer.

17. The method of laminating a wafer as claimed in claim 16, wherein said step of irradiating is carried out before said step of severing is begun.

18. The method of laminating a wafer as claimed in claim 16, wherein said step of irradiating is carried out after said step of severing has begun.

19. The method of laminating a wafer as claimed in claim 16, wherein said step of irradiating is carried out simultaneously with said step of cutting.

20. The method of laminating a wafer as claimed in claim 16, wherein said step of attaching comprises attaching a UV tape comprising a base film of polyolefin coated on one side with an acryllate adhesive having a photoinitiator.

21. The method of laminating a wafer as claimed in claim 20, wherein the photoinitiator is a radical reactant of a Norrish type which dissolves a C—C sigma bond adjacent to the carbonyl group.

22. The method of laminating a wafer as claimed in claim 16, wherein said step of attaching comprises attaching a UV tape having an adhesive strength which decreases rapidly in value when irradiated with increasing amounts of ultra-violet radiation in a domain between 30 $mJ/cm^2$ and 130 $mJ/cm^2$, finally leveling off at a value of approximately 25 g/inch, when the tape is in an environment where the temperature is 23 degrees Celsius and the relative humidity is 50%.

23. The method of laminating a wafer as claimed in claim 22, wherein said step of irradiating comprises irradiating the edge of the UV tape with ultra-violet rays having an intensity greater than 70 $mJ/cm^2$ to reduce the adhesive strength of the adhesive tape to below 60 g/inch.

24. The method of laminating a wafer as claimed in claim 22, wherein said step of irradiating comprises irradiating the edge of the UV tape with ultra-violet rays having an intensity greater than 100 mJ/cm² to reduce the adhesive strength of the adhesive tape to below 50 g/inch.

25. The method of laminating a wafer as claimed in claim 22, wherein said step of irradiating comprises irradiating the edge of the UV tape with ultra-violet rays having an intensity greater than 130 mJ/cm² to reduce the adhesive strength of the adhesive tape to below 40 g/inch.

26. The method of laminating a wafer as claimed in claim 22, wherein said step of irradiating comprises irradiating the edge of the UV tape with ultra-violet rays having an intensity greater than 350 mJ/cm².

27. The method of laminating a wafer as claimed in claim 16, wherein said step of irradiating comprises irradiating only that portion of the edge of the UV tape which is spaced 1 mm radially outwardly from the peripheral edge of the wafer.

28. The method of laminating a wafer as claimed in claim 16, wherein said step of irradiating comprises rotating an illuminator from which ultra-violet rays are discharged, in a direction around the wafer to irradiate the edge of the UV tape.

29. The method of laminating a wafer as claimed in claim 17, wherein said step of irradiating comprises rotating an illuminator from which ultra-violet rays are discharged, in a direction around the wafer to irradiate the edge of the UV tape.

30. The method of laminating a wafer as claimed in claim 19, wherein said step of irradiating comprises rotating an illuminator from which ultra-violet rays are discharged, in a direction around the wafer to irradiate the edge of the UV tape.

31. The method of laminating a wafer as claimed in claim 16, wherein said step of severing comprises rotating the wafer, and positioning a wire in contact with the peripheral edge of the wafer as the wafer is rotated.

32. The method of laminating a wafer as claimed in claim 17, wherein said step of severing comprises rotating the wafer, and positioning a wire in contact with the peripheral edge of the wafer as the wafer is rotated, and said step of irradiating is carried out at a location from which the edge of the UV tape moves toward the wire.

33. The method of laminating a wafer as claimed in claim 18, wherein said step of severing comprises rotating the wafer, and positioning a wire in contact with the peripheral edge of the wafer as the wafer is rotated, and said step of irradiating is carried out at a location at which the edge of the UV tape has come from the wire.

* * * * *